United States Patent [19]

Gillett et al.

[11] Patent Number: 4,499,523
[45] Date of Patent: Feb. 12, 1985

[54] ELECTRONIC COMPONENT ASSEMBLY WITH A PRINTED CIRCUIT BOARD UNIT AND COVER

[75] Inventors: John B. Gillett, Kingston; John A. Miraglia, West Hurley, both of N.Y.

[73] Assignee: International Business Machines Corporation, Armonk, N.Y.

[21] Appl. No.: 480,427

[22] Filed: Mar. 30, 1983

[51] Int. Cl.³ .............................................. H05K 7/14
[52] U.S. Cl. .................................... 361/383; 339/36; 361/415
[58] Field of Search ............... 361/380, 381, 382, 383, 361/414, 395, 415, 399, 412; 174/138 F; 339/61 R, 61 M, 94 M, 36, 23, 40, 20, 21 R, 75 M, 75 MP, 176 MP, 17 LM; 206/328; 200/302.1

[56] References Cited

U.S. PATENT DOCUMENTS

| 3,631,299 | 12/1971 | Meyer ................................ | 361/412 |
| 3,706,010 | 12/1972 | Laemer et al. ..................... | 361/383 |
| 4,226,491 | 10/1980 | Kazama et al. ............... | 339/17 LM |
| 4,386,388 | 5/1983 | Beun .................................. | 361/395 |

OTHER PUBLICATIONS

IBM Technical Disclosure Bulletin, vol. 24, No. 8, 1/82, pp. 4371-4373.
IBM Technical Disclosure Bulletin, vol. 24, No. 11B, Apr. 1982, "Protective Contamination Shield for Circuit Board Edge Connectors" to J. R. Taylor, pp. 5850-5851.

*Primary Examiner*—A. D. Pellinen
*Assistant Examiner*—Gregory D. Thompson
*Attorney, Agent, or Firm*—David D. Bahler; E. Lester; J. Jancin, Jr.

[57] ABSTRACT

An electronic component assembly including a printed circuit board unit and a protective cover wherein the cover has flexible flap portions that protect electrical contact pads disposed along at least one edge of the printed circuit board unit. The flap portions can be flexed to expose the electrical contact pads. Removal of the flexing force allows the flaps to return to their relaxed, closed positon by means of the internal resiliency of the cover material. Such flexing of the flap portions can be effected by surfaces of a corresponding mating connector so as to expose the contact pads to the contact pins of the mating connector. When the electronic component assembly is removed from the mating connector, the printed circuit board unit is contained by (i.e., completely surrounded by) the cover thereby protecting the unit from physical impact or dust.

15 Claims, 10 Drawing Figures

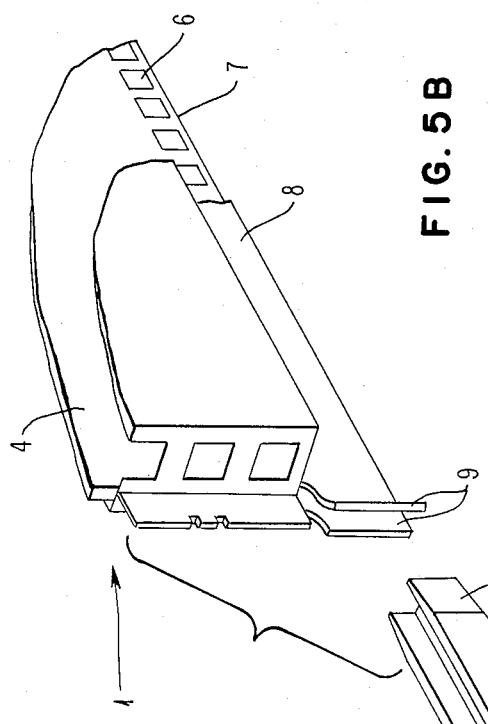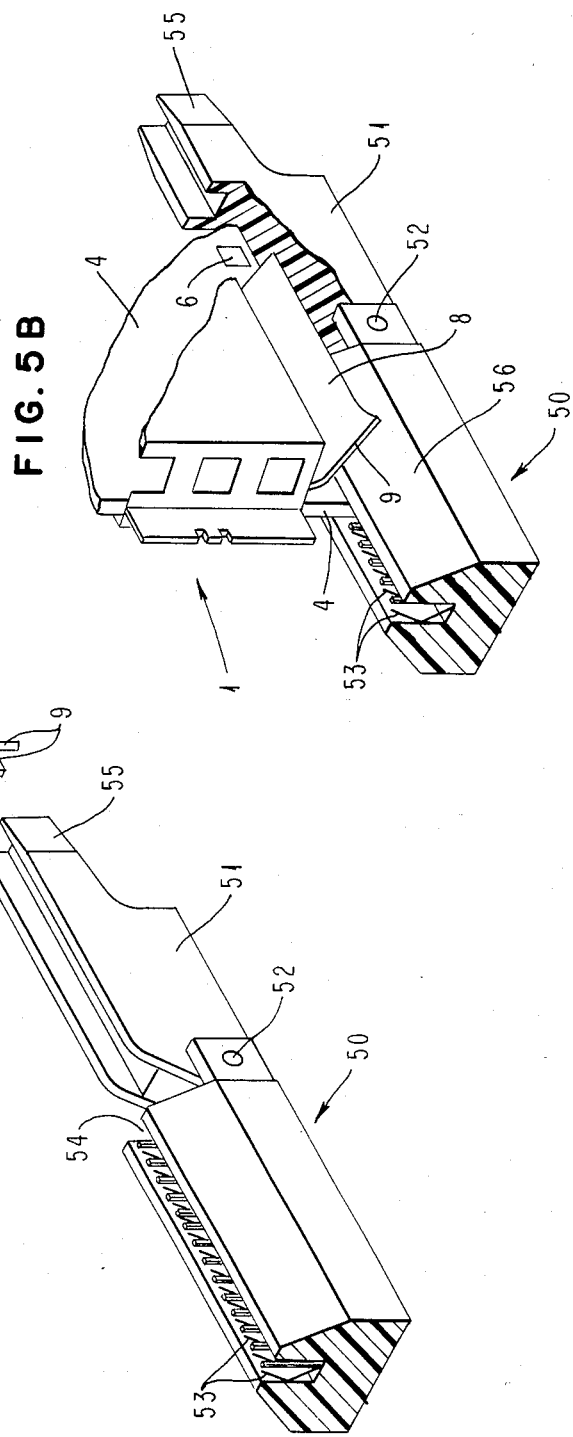

ELECTRONIC COMPONENT ASSEMBLY WITH A PRINTED CIRCUIT BOARD UNIT AND COVER

DESCRIPTION

1. Technical Field

This invention relates to an electronic component assembly including a printed circuit board unit with a protective cover for containing the printed circuit board unit.

2. Background Art

Present electronic systems often use a modular concept wherein the components of the system can be reconfigured or new components can be added with a minimum of effort by the system user. This is particularly evident in the area of digital processing systems adapted for use in the home or office where the replaceable components are typically printed circuit board units with digital processing circuitry thereon. In such an environment, it is desirable to facilitate the insertion and removal of the components by even a non-technical user and to protect the components from impact and dust when they are removed from the system. Covering the printed circuit board unit as disclosed and claimed herein is a solution to this problem.

The background art discloses, for example, an electronic device including a printed circuit board unit and a cover, which cover is molded from a single piece of plastic material to reduce manufacturing and assembly costs. This printed circuit board unit has an integral handle formed thereon to facilitate handling, and a single edge-type connector for electrical connection. However, the configuration offers no protection for the edge-type connector when the electronic device is removed from its utilization equipment. Also, the configuration requires a special board unit shape resulting in increased cost.

It is imperative that the circuit components located on the printed circuit board unit be protected from damage while the board unit is removed from the utilization equipment. It is also important that the circuit traces and contact pads on the printed circuit board unit be protected.

Another example of background art discloses a cartridge cover that protects the components on a printed circuit board unit as well as the circuit traces and contact pads. The cartridge cover is mechanically complicated because it is molded in a number of pieces and incorporates a spring or other biasing means to urge a shield piece to a closed position so as to conceal an edge-type connector on the board unit. The cartridge cover does not provide for electrical connection to more than one edge of the printed circuit board unit. Further, the multiple piece construction undesirably increases manufacturing and assembly costs.

The present invention is an improvement over such art because it provides a printed circuit board unit with a cover that completely encloses the board unit, circuit traces and contact pads located along edges of the board while maintaining simplicity and low manufacturing and assembly costs.

DISCLOSURE OF THE INVENTION

The invention as disclosed and claimed will remedy the drawbacks and disadvantages of the background art. It solves the problem of making an electronic component assembly with a printed circuit board unit which can be completely enclosed by an inexpensive, easily manufactured cover.

The cover will prevent damage that can be caused by physical impact to the circuit components on the board unit as well as to the circuit traces and contact pads located on the edges of the board unit. At the same time, these contact pads are accessible by flexing flap portions of the cover located at the edges of the cover over the contact pads. Such flexing of the flap portions can be effected by surfaces of a corresponding mating connector so as to expose the contact pads to the contact pins of a mating connector. When the covered electronic component assembly is in place in a mating connector, the flap portions act as a dust seal to further protect the contact pads and contact pins. If the cover is made from a material that is slightly electrically conductive, the cover will also serve as an electrostatic shield thereby protecting the electronic component assembly from the deleterious effects of static electricity.

To simplify the manufacture of the cover and the assembly of the cover with the board unit, the flexible flaps are molded integral with the cover thereby eliminating the need for connecting hardware or hinges. The flaps are molded so as to assume a relaxed, closed position over the electrical contact pads. The flaps are movable to a flexed, open position upon application of a flexing force thereby exposing the electrical contact pads. Removal of the flexing force allows the flaps to return to their relaxed, closed position by means of the internal resiliency of the cover material. This eliminates the requirement of an external biasing spring.

The insertion of the board unit into and extraction from an appropriate electrical connector can be facilitated by manufacturing the cover with an integral handle. Such handle can also serve as a placard for visual identification of the electronic component assembly.

The cover can also be formed with coded slots or protrusions that perform a keying function by mating with corresponding protrusions or slots in a mating connector.

Also, apertures can be formed in the cover to provide a means for venting the enclosed electronic components.

The foregoing and other objects, features, extensions, and advantages of the invention will be apparent from the following more particular description of the preferred embodiments of the invention, as illustrated in the accompanying drawing.

BRIEF DESCRIPTION OF DRAWINGS

FIGS. 5A and 5B show flexing of a protective edge flap during parallel entry of the electronic component assembly of FIG. 3 into a connector.

DESCRIPTION OF INVENTION

Figure 1:
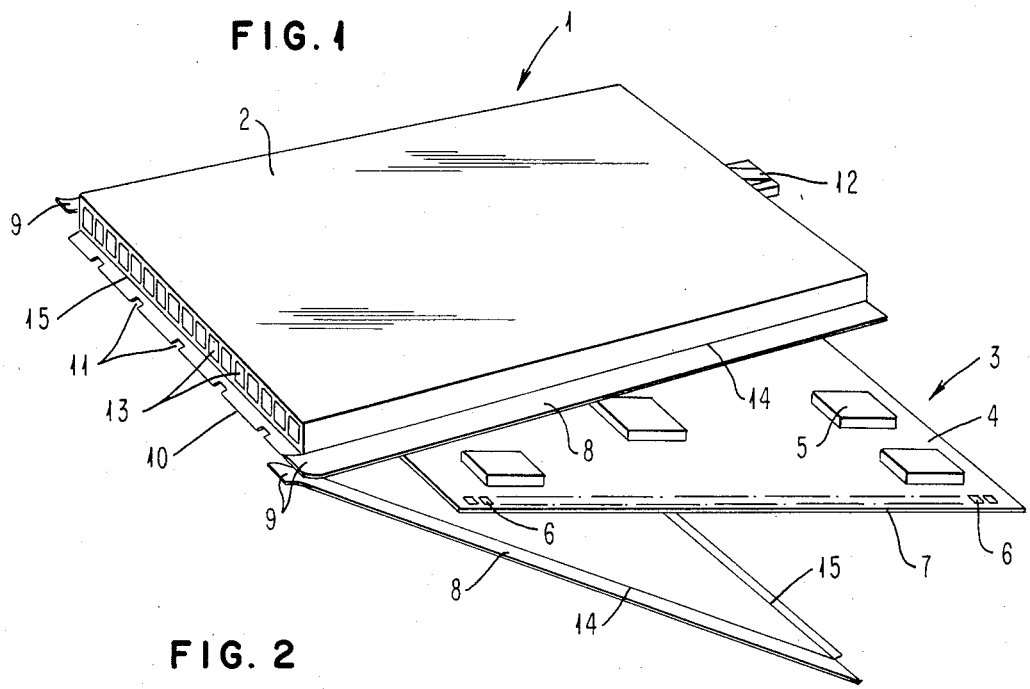
FIG. 1 shows a preferred embodiment of the invention as a single-piece shroud and a printed circuit board unit before sealing.

Referring to FIG. 1, electronic component assembly 1 includes a printed circuit board unit 3 and a single-piece shroud 2. The shroud 2 is formed from a single piece of resilient material, for example, a plastic material. The material is rigid enough to withstand mild impact without deformation, yet flexible enough to flex under sufficient force. A preferred plastic material is polyethersulfone because of its attractive molding characteristics and flexibility coupled with its electrical insulating properties and flame retardant properties. If desired, a slightly electrically conductive material can be used to allow the shroud to act as an electrostatic shield. The selection of resilient material for shroud 2 is primarily a function of the specific application of the electronic component assembly 1. The designation of any particular material should not be construed to delimit the invention in any manner.

Figure 2:
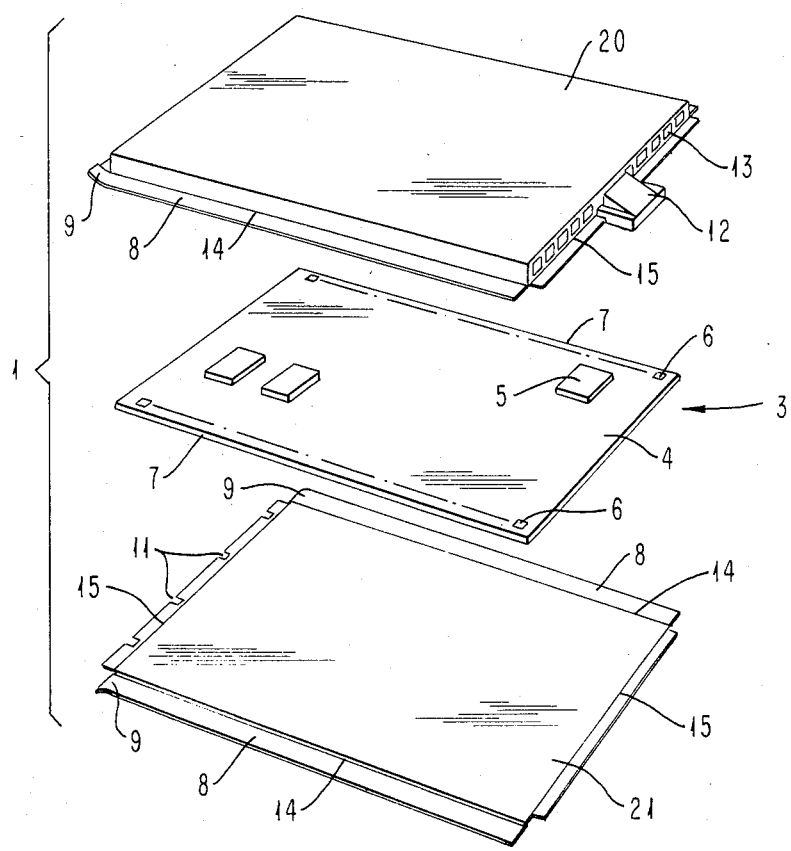
FIG. 2 shows another embodiment of the invention as a two-piece shroud and a printed circuit board unit before sealing.

Referring now to FIG. 2, electronic component assembly 1 includes a printed circuit board unit 3 and a two-piece shroud having a top piece 20 for covering the top side of printed circuit board unit 3, and a bottom piece 21 for covering the bottom side of printed circuit board unit 3. The two-piece shroud shown in FIG. 2 is formed from a plastic material similar to the plastic material of single-piece shroud 2 of FIG. 1. In FIGS. 1 and 2, printed circuit board unit 3 includes printed circuit board 4 with electronic components 5 mounted thereon. Circuit traces (not shown) connect the electronic components 5 with each other and with contact pads 6 located along the edges 7 of the printed circuit board 4. Contact pads 6 are typically oriented in rows and can be located along more than one edge 7 and on both sides of printed circuit board 4.

Shroud 2 and shroud pieces 20 and 21 are molded with integral flaps 8. Flaps 8 are located along the edges of shroud 2 and shroud pieces 20 and 21 that correspond to printed circuit board edges 7 along which pads 6 are located. Flaps 8 are molded to assume a relaxed position wherein flaps 8 completely cover printed circuit board edge 7 and pads 6. Flaps 8 can be flexed to expose the pads 6 for electrical contact. The flexing is typically done by a corresponding mating connector which action is described below.

Flaps 8 are formed with lip portions 9 that cooperate with surfaces on a mating connector to move flaps 8 from a relaxed closed position to a flexed open position during insertion of the electronic component assembly 1 into the connector. Lip portions 9, shown in FIGS. 1 and 2, are disposed to allow parallel entry of the electronic component assembly 1 into a mating connector. Parallel entry signifies the electronic component assembly 1 entering the mating connector in the same direction as, or parallel to, the longitudinal dimension of the mating connector and is illustrated in FIG. 5. This too will be described below.

Shroud 2 (see FIG. 1) is formed with an integral hinge portion 10 which allows shroud 2 to be folded over the printed circuit board unit 3. Hinge portion 10 can have polarizing notches 11 disposed along its length which serve to uniquely identify electronic component assembly 1. Notches 11 mate with polarizing keys (not shown) located in a mating connector. The two-piece shroud (20, 21) of FIG. 2 can also have polarizing notches 11 disposed along an edge thereof. Although notches are shown in these embodiments, it should be understood that protrusions or a combination of notches and protrusions would also serve the purpose of identification.

Handle 12 (see FIGS. 1 and 2) may be formed integral with shroud 2 or with shroud pieces 20 or 21. Handle 12 is used by an operator when inserting or extracting electronic component assembly 1 into or from a mating connector. The handle 12 can also be used as a placard to display a printed part number or other identifying indicia.

Shroud 2 and shroud pieces 20 or 21 can be formed with vent apertures 13 that allow cooling air to reach the enclosed printed circuit board unit 3, particularly, the electronic components 5.

In the embodiments shown in FIGS. 1 and 2, the shroud 2 and shroud pieces 20 and 21 are held in a closed position by sealing means applied along lines 14 and 15. Along lines 14, the shroud is sealed to the printed circuit board 4 so that pads 6 are between the seal and the printed circuit board edge 7. This will allow the flaps 8 to flex, thereby exposing pads 6 without exposing electrical components 5. Along lines 15, the shroud 2 is sealed to itself whereas the shroud pieces 20 and 21 are sealed to each other. The seal along lines 14 and 15 can be produced by an ultrasonic bond or by use of a chemical adhesive.

Figure 3:
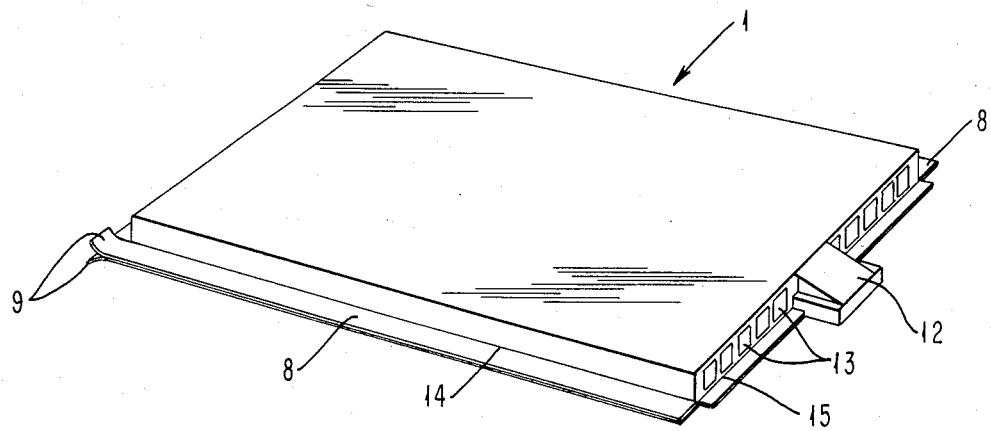
FIG. 3 is a view of the electronic component assembly of FIG. 1 or FIG. 2 after sealing.

Sealing along lines 14 and 15 will result in an electronic component assembly 1 as shown in FIG. 3. In FIG. 3, the printed circuit board unit (shown as element 3 in FIGS. 1 and 2) is contained by (i e., completely surrounded by) the shroud 2 or by shroud pieces 21 and 22. Flaps 8 are shown in the relaxed position completely covering electrical contact pads 6 (shown in FIGS. 1 and 2). The electronic component assembly 1 is therefore resistant to physical impact and dust that would plague an exposed printed circuit board unit. Also, the electronic component assembly 1 has a non-technical appearance that is pleasing to the eye and that is less intimidating than an exposed printed circuit board unit to a non-technical user.

Figure 4:
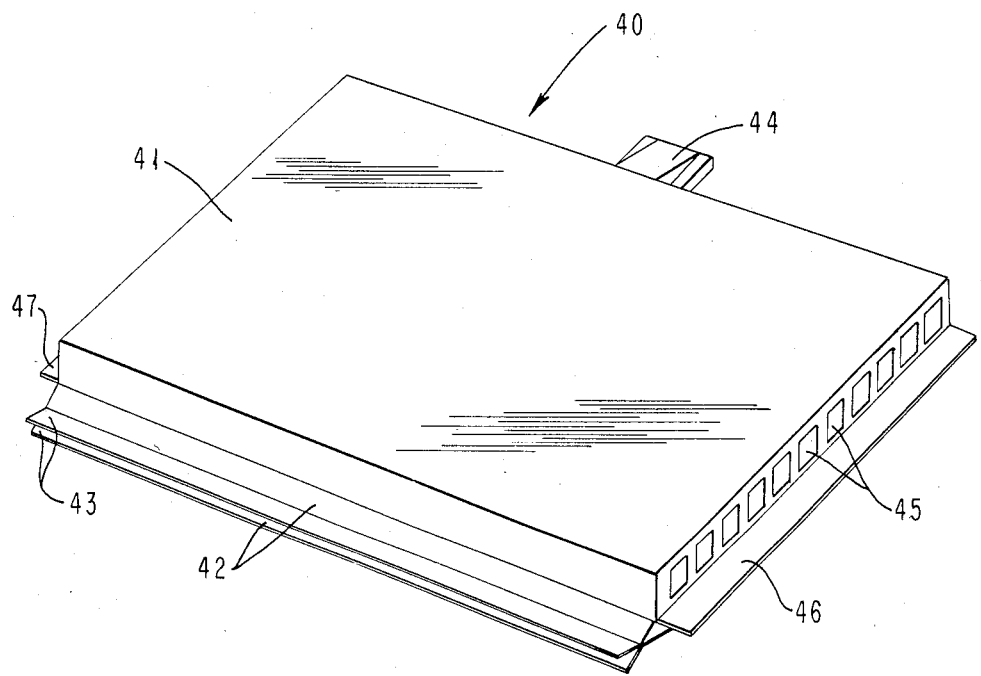
FIG. 4 is still another embodiment of the electronic component assembly after sealing.
Figure 7:
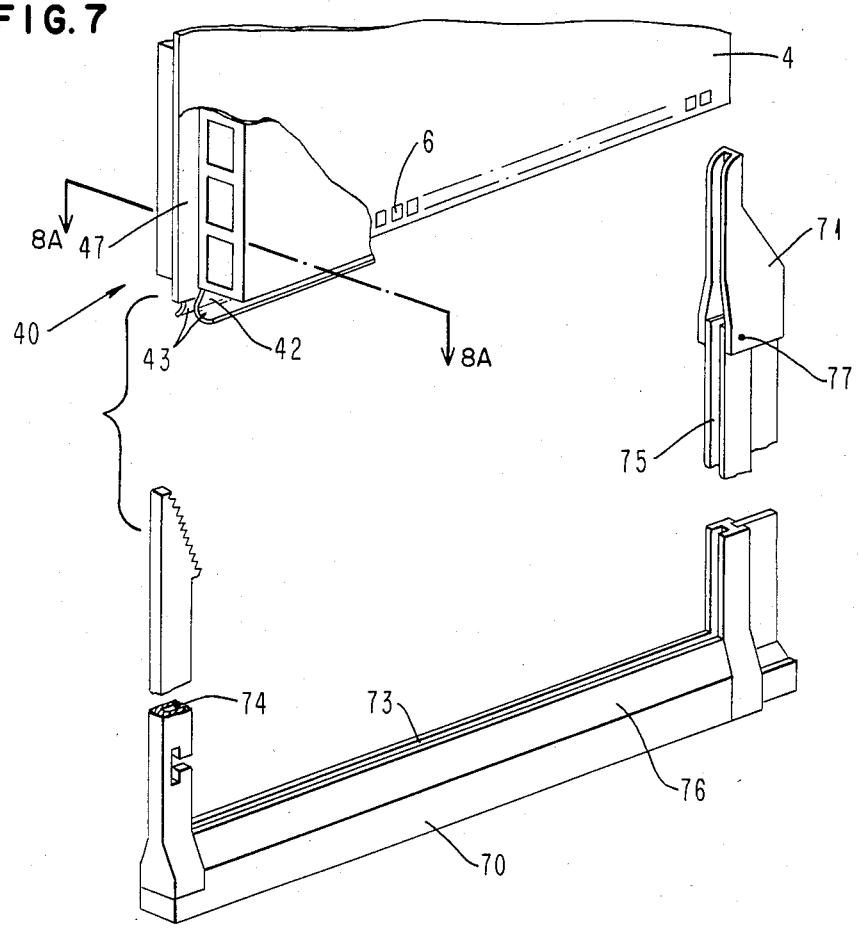
FIG. 7 is the electronic component assembly of FIG. 4 during normal entry into a single edge connector.

FIG. 4 presents another embodiment of the present invention. Here electronic component assembly 40 includes a shroud 41 enclosing a printed circuit board unit (not shown). Shroud 41 can be molded from a single piece with an integral hinge similar to shroud 2 shown in FIG. 1, or it can be molded in two pieces similar to shroud pieces 20 and 21, shown in FIG. 2. Flaps 42 conceal contact pads disposed along one edge of the enclosed printed circuit board unit. Flaps 42 have lip portions 43 running along the entire length of flaps 42. Lip portions 43 facilitate the flexing of the flaps 42 during normal entry of electronic component assembly 40 into a mating connector. Normal entry signifies electronic component assembly 40 entering the mating connector in a direction that is perpendicular or normal to the longitudinal dimension of the mating connector. A connector and electronic component assembly disposed for normal entry is illustrated in FIG. 7 and will be discussed in detail later.

Here it should be noted that lip portions 9 (see FIGS. 1 and 2) and lip portions 43 (see also FIG. 4) can be combined in a single electronic component assembly, thereby providing the assembly with the capability of either parallel entry, or normal entry, or both. into a mating connector.

Similar to the previous embodiments, electronic component assembly 40 can have a handle 44 to facilitate insertion and extraction, and can have vent apertures 45 for cooling.

Electronic component assembly 40 can be mechanically polarized to require the assembly 40 to be inserted into a mating connector in the proper orientation. One way to accomplish this mechanical polarization is to mold edge 46 in a first thickness and edge 47 in a different second thickness. The guides of the mating connector can then be of different widths such that the mating connector will accept electronic component assembly 40 in only one orientation. If assembly 40 is reversed for attempted insertion into the connector, the thinner of the two connector guides will meet the thicker of the two edges (46 or 47) and assembly 40 will not be able to slide into the connector guides. This interaction is shown in FIG. 7.

FIGS. 5A and 5B show the action of mating connector 50 with lip portions 9 and flaps 8 on electronic component assembly 1 during parallel entry of assembly 1 into mating connector 50.

In FIG. 5A, electronic component assembly 1 is poised to enter connector 50. Connector 50 is typically of the zero insertion force type, wherein actuating handle 51 is pivoted about hinge pin 52 in a counterclockwise direction thereby moving a camming mechanism (not shown) internal to connector 50 which, in turn, moves contact pins 53 from a position outside of channel 54 to a position within channel 54. For insertion and extraction of electronic component assembly 1, handle 51 is in the position shown in FIGS. 5A and 5B and contact pins 53 are outside of channel 54, thereby providing printed circuit board 4 a clear path to enter channel 54. After electronic component assembly 1 is completely inserted into connector 50, actuating handle 51 is pivoted about pin 52 thereby causing pins 53 to move into channel 54 and to contact electrical contact pads 6 disposed along edge 7 of printed circuit board 4.

Handle 51 has a tapered section 55 that cooperates with lip portions 9 of electronic component assembly 1 during insertion of assembly 1 into connector 50. Tapered section 55 serves to split lip portions 9 and thereafter to split flaps 8 as assembly 1 progresses longitudinally of connector 50 during parallel insertion.

FIG. 5B shows electronic component assembly 1 partially inserted into connector 50. The edge 7 of printed circuit board 4 is progressively uncovered and lip portions 9 and flaps 8 ride on the outside surface 56 of connector 50. When electronic component assembly 1 is completely inserted into connector 50, individual contact pads 6 will be positioned opposite corresponding contact pins 53 and flaps 8 will form a dust seal for channel 54.

Figure 6:
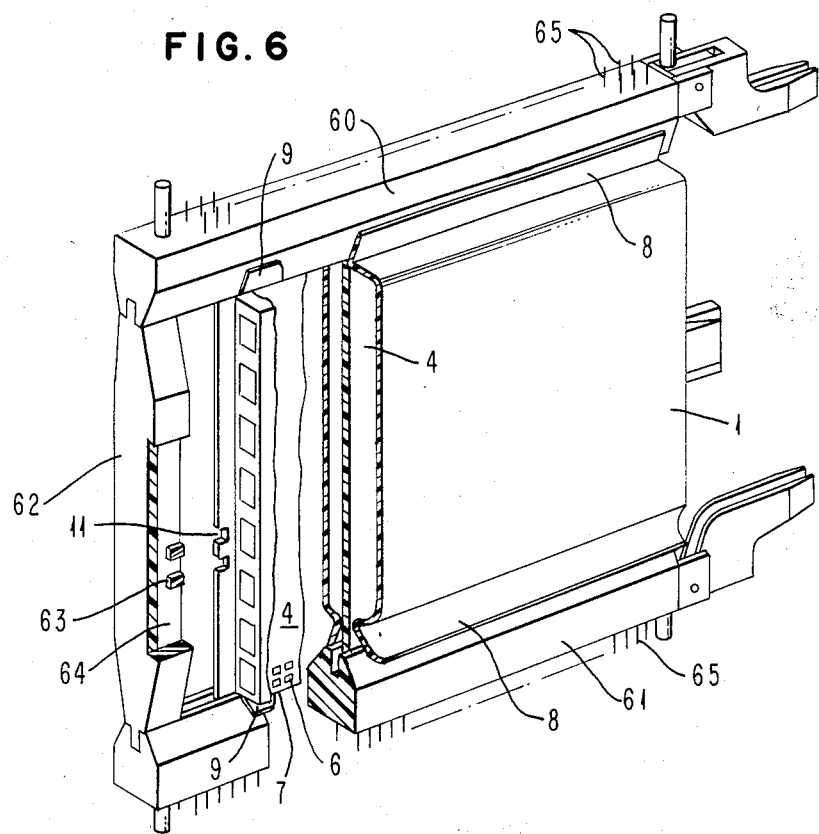
FIG. 6 is the electronic component assembly of FIG. 3 partially inserted into an opposing pair of electrical connectors.

Referring to FIG. 6, connectors 60 and 61 are typically of the zero insertion force type and are spaced apart by cross member 62. Connectors 61 and 62 are spaced to receive the electronic component assembly 1 of FIG. 3 which is shown to be partially inserted into connector pairs 60 and 61.

Cross member 62 has polarizing keys 63 located in a recess 64 therein. Polarizing keys 64 are configured to mate with polarizing notches 11 disposed along the edge of electronic component assembly 1. Polarizing keys 63 and notches 11 are designed to ensure that the proper electronic component assembly 1 will mate only with the proper mating connector pair 60 and 61.

Lip portions 9 and flaps 8 are shown in the flexed position and contact pads 6 are exposed to contact pins (not shown). Flaps 8 now form a dust seal.

Electronic component assembly 1 is shown to have contact pads 6 located along two edges 7 thereof. However, it should be understood that an electronic component assembly with pads disposed along only one edge could be accommodated by replacing one of the connectors (60 or 61) with a guide having no contact pins.

Electrical leads 65 are electrically connected to contact pins (not shown) within the body of connector 60 and 61. These contact pins are configured to make electrical contact with contact pads 6 located along edges 7 of printed circuit board 4. Leads 65 are typically soldered into a mother board (not shown) and thereby provide electrical connection paths between components mounted on printed circuit board 4 and external circuitry.

Referring now to FIG. 7, the electronic component assembly 40, illustrated in FIG. 4, is poised for normal entry into connector 70. In FIG. 7, connector 70 is shown to be of the zero insertion force type wherein actuating handle 71 is pivoted about pin 77 in a counterclockwise direction thereby moving a camming mechanism (not shown) internal to connector 70 which, in turn, moves contact pins (not shown) into channel 73. It should be noted that connector 70 need not be of the ZIF type for this normal entry embodiment. The contact pins are arranged to make contact with pads 6 on printed circuit board 4.

Guide slot 74 is of a first width to accommodate electronic component assembly edge 47 and guide slot 75 is of a second width to accommodate electronic component assembly edge 46 (shown in FIG. 4). If electronic component assembly 40 is physically reversed (i.e., edge 47 is above slot 75 and edge 46 is above slot 74) the different thicknesses of edges 46 and 47 will no longer fit into guide slots 74 and 75 and electronic component assembly 40 will be precluded from sliding into connector 70.

Figure 8A:
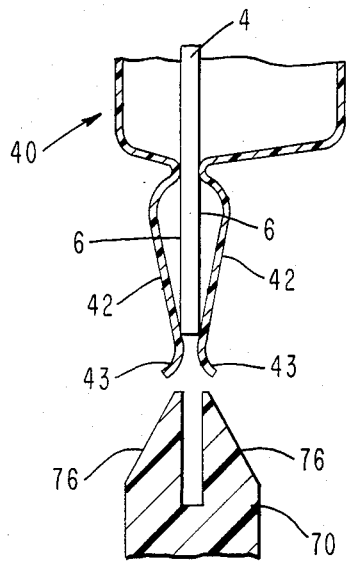
FIGS. 8A and 8B are views through section 8A—8A of FIG. 7 showing the flexing of the protective edge flaps during normal entry of the electronic component assembly of FIG. 4 into a connector.
Figure 8B:
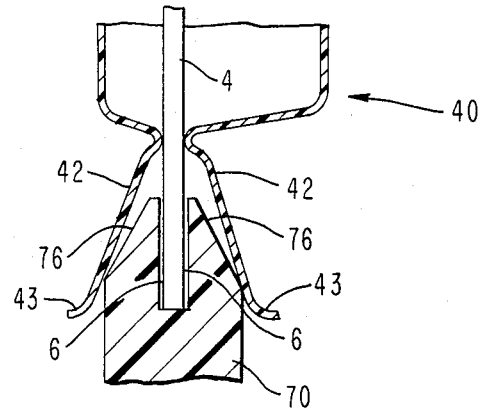

Connector 70 is provided with bevelled surfaces 76 that force lip portions 43 and flaps 42 apart to expose the underlying pads 6. This action is illustrated in FIG. 8A which is a view taken through section 8A—8A of FIG. 7. FIG. 8A shows the electronic component assembly 40 just before contacting bevelled surfaces 76. FIG. 8B shows electronic component assembly 40 completely seated in connector 70 after bevelled surfaces 76 have forced apart lip portions 43 and flaps 42. As can be seen in FIG. 8B, flaps 42 now form a dust seal for enclosed contact pads 6 and corresponding contact pins.

It will be understood that the preferred embodiments herein presented are for illustrative purposes, and, as such, will not be construed to place limitations on the invention. Those skilled in the art will understand that changes in the form and detail of the preferred embodiments recited may be made without departing from the spirit and scope of the invention.

We claim:
1. An electronic component assembly comprising:
a printed circuit board unit having electrical contact pads disposed along at least one edge thereof;
a cover containing said printed circuit board unit;
said cover including,
sealing means retaining said printed circuit board unit within said cover and maintaining said cover in a closed position whereby said printed circuit board unit is in fixed contact with said cover, and flexible flap means, integral with said cover, movable between a relaxed first position wherein the flap means conceals said electrical contact pads, and a flexed second position wherein the flap means exposes said electrical contact pads.

2. In an electronic component assembly including a printed circuit board unit with electrical contact pads disposed along one edge thereof, and a cover constructed from a single member containing said printed circuit board unit, said cover comprising:
hinge means folding said cover over said printed circuit board unit;
sealing means retaining said cover in a closed position and maintaining said cover in fixed contact with said printed circuit board unit; and
flexible flap means, associated with said printed circuit board unit edge and integral with said cover, movable between a relaxed first position wherein the flap means conceals said electrical contact pads, and a flexed second position wherein the flap means exposes said electrical contact pads.

3. In an electronic component assembly including a printed circuit board unit with electrical contact pads disposed along two substantially parallel edges thereof, and a cover constructed from a single member containing said printed circuit board unit, said cover comprising:
hinge means folding said cover over said printed circuit board unit;
sealing means retaining said cover in a closed position and maintaining said cover in fixed contact with said printed circuit board; and
flexible flap means, associated with each of said parallel edges and integral with said cover, movable between a relaxed first position wherein the flap means conceals said electrical contact pads, and a flexed second position wherein the flap means exposes said electrical contact pads.

4. An electronic component assembly according to claims 2 or 3 wherein said cover is constructed from plastic material.

5. An electronic component assembly according to claims 2 or 3 wherein said cover is constructed from polyethersulfone material.

6. An electronic component assembly according to claim 2 or 3 additionally comprising coding means associated with said hinge for uniquely identifying said electronic component.

7. An electronic component assembly according to claim 6 wherein said coding means includes a combination of notches and protrusions.

8. An electronic component assembly according to claim 2 or 3 wherein said sealing means is a chemical adhesive.

9. An electronic component assembly according to claim 2 or 3 wherein said sealing means is an ultrasonic bond.

10. An electronic component assembly according to claims 2 or 3 for use in a utilization device, wherein said cover additionally comprises a handle, integral with said cover, for inserting and extracting said electronic component into and from said utilization device.

11. An electronic component assembly according to claims 2 or 3 wherein said cover additionally comprises aperture means for air venting said printed circuit board unit.

12. An electronic component according to claim 2 wherein said cover additionally comprises coding means for mechanically polarizing said electronic component assembly, said coding means including different edge thicknesses for two substantially parallel edges of said cover.

13. An electronic component assembly according to claim 2 or 3 wherein said cover is constructed from a slightly electrically conductive material.

14. In an electronic component assembly including a printed circuit board unit with electrical contact pads disposed along one edge thereof, and a cover for containing said printed circuit board unit, said cover comprising:
two halves, each half constructed to cover a respective one side of said printed circuit board unit;
sealing means for retaining said halves in a closed position surrounding said printed circuit board unit and for maintaining said cover in fixed contact with said printed circuit board unit; and
flexible flap means, associated with said printed circuit board unit edge and integral with said cover halves, movable between a relaxed first position wherein the flap means conceals said electrical contact pads, and a flexed second position wherein the flap means exposes said electrical contact pads.

15. In an electronic component assembly including a printed circuit board unit with electrical contact pads disposed along two substantially parallel edges thereof, and a cover containing said printed circuit board unit, said cover comprising:
two halves, each half constructed to cover a respective one side of said printed circuit board unit;
sealing means retaining said halves in a closed position surrounding said board and maintaining said halves in fixed contact with said printed circuit board unit; and
flexible flap means, associated with each of said parallel edges and integral with said cover halves, movable between a relaxed first position wherein the flap means conceals said electrical contact pads, and a flexed second position wherein the flap means exposes said electrical contact pads.

* * * * *